(12) United States Patent
Bruin (10) Patent No.: US 8,179,192 B2
(45) Date of Patent: May 15, 2012

(54) SIGNAL PROCESSOR COMPRISING A REFERENCE VOLTAGE CIRCUIT

(75) Inventor: Paulus P. F. M. Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 469 days.

(21) Appl. No.: 12/529,763

(22) PCT Filed: Mar. 5, 2008

(86) PCT No.: PCT/IB2008/050797
§ 371 (c)(1),
(2), (4) Date: Sep. 3, 2009

(87) PCT Pub. No.: WO2008/107849
PCT Pub. Date: Sep. 12, 2008

(65) Prior Publication Data
US 2010/0109614 A1 May 6, 2010

(30) Foreign Application Priority Data
Mar. 7, 2007 (EP) ..................................... 07103683

(51) Int. Cl.
*G06F 1/10* (2006.01)
(52) U.S. Cl. .......................... 327/538; 327/310; 327/379
(58) Field of Classification Search .................. 327/309, 327/310, 312, 379, 380, 381, 530, 535, 537, 327/538, 540, 543
See application file for complete search history.

(56) References Cited

U.S. PATENT DOCUMENTS

| | | | |
|---|---|---|---|
| 6,316,993 B1 | 11/2001 | Hellums | |
| 6,775,387 B1 | 8/2004 | Mavencamp et al. | |
| 7,567,063 B1 * | 7/2009 | Suzuki et al. | 320/166 |
| 7,573,252 B1 * | 8/2009 | Griesert | 323/315 |
| 2005/0084120 A1 | 4/2005 | Hagino | |
| 2005/0140432 A1 | 6/2005 | Nair et al. | |

FOREIGN PATENT DOCUMENTS

| | | |
|---|---|---|
| EP | 570655 A1 | 11/1993 |
| FR | 2866763 A | 8/2005 |
| JP | 8069332 A | 3/1996 |
| WO | 02/15388 A | 2/2002 |
| WO | 2005112252 A1 | 11/2005 |

* cited by examiner

*Primary Examiner* — Jeffrey Zweizig (57) ABSTRACT

A signal processor comprises a reference voltage circuit (RVC) for imposing a reference voltage (VR) onto a capacitance (Cr). The reference voltage circuit (RVC) comprises a negative slope module (NSM) for providing a negative slope signal (SN), which has a magnitude that decreases when a voltage that is present on the capacitance (Cr) increases. A positive slope module (PSM) provides a positive slope signal (SP), which has a magnitude that increases when the voltage that is present on the capacitance (Cr) increases. A minimum selection module (MSM) controls a maximum current (IMX) that the reference voltage circuit (RVC) can apply to the capacitance (Cr) substantially in dependence on the negative slope signal (SN), if the magnitude of the negative slope signal (SN) is smaller than that of the positive slope signal (SP). The minimum selection module (MSM) controls the maximum current substantially in dependence on the positive slope signal (SP), if the magnitude of the positive slope signal (SP) is smaller than that of the negative slope signal (SN).

11 Claims, 5 Drawing Sheets

SIGNAL PROCESSOR COMPRISING A REFERENCE VOLTAGE CIRCUIT

FIELD OF THE INVENTION

An aspect of the invention relates to a signal processor that comprises a reference voltage circuit. The signal processor may be, for example, an audio amplifier that can operate with a single supply voltage. The reference voltage circuit may provide, for example, a reference voltage that is half way between the single supply voltage and signal ground. Other aspects of the invention relate to a method of providing a reference voltage, and a computer program product.

BACKGROUND ART

A signal-processing circuit that can operate with a single supply voltage typically has a reference voltage input to which a reference voltage should be applied. In many applications, the reference voltage input should be coupled to signal ground via a relatively large capacitance, which constitutes a short circuit within a frequency range of interest. This relatively large capacitance will be referred to as reference voltage capacitance hereinafter. A reference voltage circuit imposes the reference voltage onto the reference voltage capacitance. The reference voltage is typically in between the supply voltage and signal ground.

The signal-processing circuit exhibits a transitional behavior when the single supply voltage is switched on. The same applies when the single supply voltage is switched off. This transitional behavior is connected with a charging or a discharging of the reference voltage capacitance, whichever applies. The transitional behavior may cause the signal-processing circuit to produce an undesired output signal. For example, in audio applications, the transitional behavior may cause an audible plop or click sound when switching on or switching off the single supply voltage. Such an undesired transitional behavior can be prevented by charging or discharging the reference voltage capacitance, whichever applies, in accordance with an S-curve characteristic.

US patent application published under number 2005/0084120 discloses a signal ground voltage generation circuit within an audio power amplifier. The signal ground voltage generation circuit includes a voltage follower amplifier, which is coupled between a reference voltage source and a signal ground terminal. The voltage follower amplifier outputs a current, which charges a capacitor that is coupled to the signal ground terminal. A current control circuit controls this output current so that the output current is equivalent to a maximum current.

The current control circuit comprises two differential MOSFET pairs, each of which has a gate that is coupled to the signal ground terminal. One differential MOSFET pair receives a first midpoint voltage. The other differential MOSFET pair receives a second midpoint voltage. The maximum output current is the sum of a difference between drain currents of the one differential MOSFET pair and a difference between drain currents of the other differential MOSFET pair. That is, the maximum current results from applying addition operations and subtraction operations to a plurality of currents, which vary as a function of a voltage on the signal ground terminal.

SUMMARY OF THE INVENTION

It is an object of the invention to allow an improved transition behavior of a reference voltage, which counters plop and click sounds in audio applications. The independent claims define various aspects of the invention. The dependent claims define additional features for implementing the invention to advantage.

The invention takes the following points into consideration. The signal ground voltage generation circuit described in the aforementioned patent application controls the maximum current by means of a relatively complicated set of additions and subtractions in a current domain. Moreover, the maximum current varies as a function of two so-called midpoint voltages, which need to be precisely defined. As a result, the maximum current will be relatively sensitive to component tolerances, mismatch, ambient conditions, and aging. The maximum current may therefore not provide a sufficiently precise approximation of the aforementioned S-curve characteristic. Audio applications may therefore still suffer from an audible plop or click sound.

Moreover, the signal ground voltage generation circuit described in the aforementioned patent application is only capable of producing the S-curve characteristic when switching on the supply voltage. That is, the circuit does not prevent undesired transitional effects, such as, for example, plop or click sound, from occurring when switching off the supply voltage. The circuit only works "one-way".

In accordance with the invention, a signal processor comprises a reference voltage circuit for imposing a reference voltage onto a capacitance, which has the following characteristics. A negative slope module provides a negative slope signal, which has a magnitude that decreases when a voltage that is present on the capacitance increases. A positive slope module provides a positive slope signal, which has a magnitude that increases when the voltage that is present on the capacitance increases. A minimum selection module controls a maximum current that the reference voltage circuit can apply to the capacitance substantially in dependence on the negative slope signal, if the magnitude of the negative slope signal is smaller than that of the positive slope signal. The minimum selection module controls the maximum current substantially in dependence on the positive slope signal, if the magnitude of the positive slope signal is smaller than that of the negative slope signal.

Accordingly, the invention offers a fundamentally different technique for controlling a maximum current with which a reference voltage capacitance can be charged and discharged. This technique, which involves a minimum selection, does not necessitate a relatively complicated set of subtractions and additions and, moreover, does not rely on any midpoint voltages, which need to be precisely defined. Consequently, the aforementioned S-curve characteristic can be achieved with relatively great precision. What is more, the invention allows a charging as well as a discharging of the reference voltage capacitance in accordance with the S-curve characteristic. That is, the invention allows a "two-way" operation. For those reasons, the invention allows an improved transition behavior of a reference voltage, which counters plop and click sounds in audio applications.

Another advantage of the invention is that the reference voltage circuit can be implemented at relatively modest cost. This is because there is no need for a relatively complicated set of subtractions and additions.

An implementation of the invention advantageously comprises one or more of following additional features, which are described in separate paragraphs that correspond with individual dependent claims.

The negative slope module preferably comprises a comparator, which compares the voltage that is present on the reference voltage capacitance with a desired reference voltage. The maximum current has a lowest value if the voltage that is present on the capacitance is substantially equal to the desired reference voltage.

The positive slope module preferably comprises a comparator, which compares the voltage that is present on the reference voltage capacitance with a signal ground voltage. The maximum current has a lowest value if the voltage that is present on the capacitance is substantially equal to the signal ground voltage. These additional features, as well as those mentioned in the preceding paragraph, contribute to achieving the S-curve characteristic with relatively great precision.

The negative slope module preferably comprises a transconductance circuit for providing the negative slope signal in the form of a current, which is referred to as negative slope current. The positive slope module preferably comprises a transconductance circuit for providing the positive slope signal in the form of a current, which is referred to as positive slope current. The minimum selection module preferably comprises a current switch, which provides a selected control current that is based on the negative slope current, if the negative slope current is smaller than the positive slope current, and that is based on the positive slope current, if the positive slope current is smaller than the negative slope current.

The reference voltage circuit preferably comprises a differential transistor pair for comparing the voltage that is present on the reference voltage capacitance with a desired reference voltage. The differential transistor pair receives the selected control current as a tail current. A current mirror arrangement provides an output current that is based on a differential current obtained from the differential transistor pair. The reference voltage capacitance receives this output current. These additional features, as well as those mentioned in the preceding paragraph, allow low-cost implementations.

The current mirror arrangement preferably comprises a pair of current mirrors, which are arranged in a cross-coupled configuration so as to amplify the differential current obtained from the differential transistor pair.

The reference voltage circuit preferably comprises an output stage that provides an output current to the reference voltage capacitance. The output stage comprises a biasing circuit for limiting the output current as a function of the selected control current. These additional features, as well as those mentioned in the preceding paragraph, contribute to achieving the S-curve characteristic with relatively great precision.

The minimum selection module preferably comprises a first current-copying transistor, which can provide a copy of the negative slope current, and a second current-copying transistor, which can provide a copy of the positive slope current. The minimum selection module further comprises a first cascode transistor and a second cascode transistor. The first cascode transistor has a main terminal, which is coupled to a main terminal of the first current-copying transistor, and has a control terminal, which is coupled to a control terminal of the second current-copying transistor. The second cascode transistor has a main terminal, which is coupled to a main terminal of the second current-copying transistor, and has a control terminal, which is coupled to a control terminal of the first current-copying transistor. These additional features allow low-cost implementations.

A detailed description with reference to drawings illustrates the invention summarized hereinbefore, as well as the additional features.

DETAILED DESCRIPTION

Figure 1:
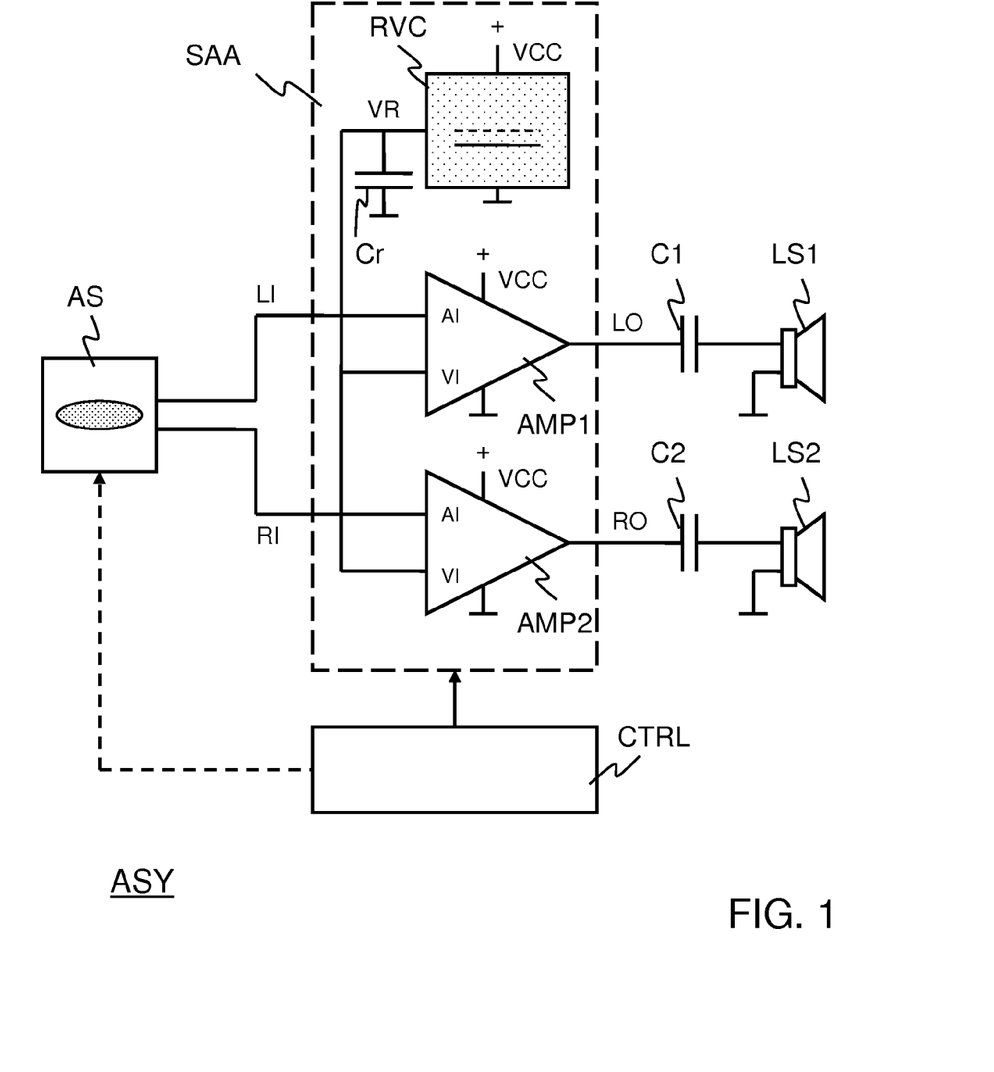
FIG. 1 is a block diagram that illustrates an audio system.

FIG. 1 illustrates an audio system ASY. The audio system ASY comprises an audio source AS, a stereo amplifier arrangement SAA, a controller CTRL, two direct-current (DC) blocking capacitors C1, C2, and two loudspeakers LS1, LS2. The audio system ASY may be in the form of, for example, a portable device, such as an MP3 player, or a personal computer. The audio source AS may be in the form of, for example, an optical disk player, a hard disk drive, a solid-state memory, or a communication network interface. The stereo amplifier arrangement SAA may be in the form of, for example, an integrated circuit device. The controller CTRL is typically in the form of a suitably programmed processor.

The stereo amplifier arrangement SAA comprises a reference voltage circuit RVC, a reference voltage capacitance Cr, and two amplifiers AMP1, AMP2: one amplifier AMP1 for a left channel, the other amplifier AMP2 for a right channel. Each amplifier has an audio input AI and a reference voltage input VI. The stereo amplifier arrangement SAA receives a single supply voltage VCC. This supply voltage VCC is applied to each of the aforementioned elements of the stereo amplifier arrangement SAA. The controller CTRL preferably manages this application of the supply voltage VCC.

The audio system ASY basically operates as follows. The audio source AS provides a left channel audio signal LI and a right channel audio signal RI. Amplifier AMP1 in the stereo amplifier arrangement SAA receives the left channel audio signal LI at its audio input AI and provides an amplified left channel audio signal LO. Amplifier AMP2 receives the right audio channel signal RI at its audio input AI and provides an amplified right audio channel signal RO. The amplified left channel audio signal LO reaches loudspeaker LS1 via DC blocking capacitor C1, which removes any DC component that may be present in the amplified left channel audio signal LO. Similarly, the amplified right channel audio signal RO reaches loudspeaker LS2 via DC blocking capacitor C2.

Each of the two amplifiers AMP1, AMP2 needs to receive a reference voltage VR at its reference voltage input VI in order to operate correctly. In a steady state mode of operation, the reference voltage VR is typically half way between the supply voltage VCC and signal ground. The reference voltage circuit RVC imposes the reference voltage VR onto the reference voltage capacitance Cr. That is, the stereo amplifier arrangement SAA, which is coupled to a single-ended power supply, generates the reference voltage VR internally by means of the reference voltage circuit RVC.

The reference voltage VR has a transitional behavior when the stereo amplifier arrangement SAA is switched on. The reference voltage VR also has a transitional behavior when the stereo amplifier arrangement SAA is switched off. These respective transitional behaviors may potentially give rise to an audible plop or click sound. The reference voltage circuit RVC, which will be described in greater detail hereinafter, prevents this.

Figure 2:
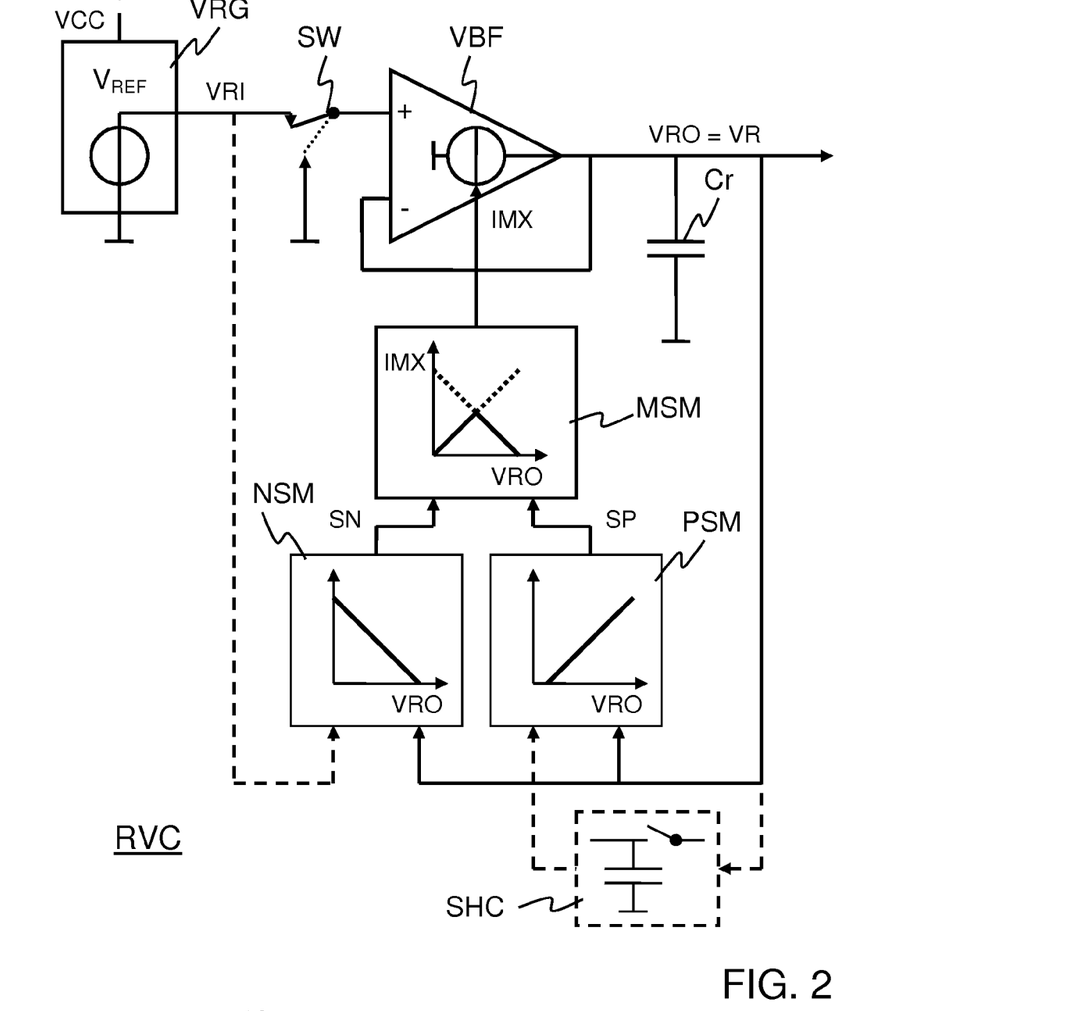
FIG. 2 is a block diagram that illustrates a reference voltage circuit, which forms part of the audio system.

FIG. 2 illustrates the reference voltage circuit RVC. The reference voltage capacitance Cr is also illustrated in FIG. 2. The reference voltage circuit RVC comprises a reference voltage generator VRG, a switch SW, and a voltage buffer VBF. The reference voltage circuit RVC further comprises a negative slope module NSM, a positive slope module PSM, and a minimum selection module MSM. The reference voltage circuit RVC may optionally comprises a sample-and-hold circuit SHC, which is illustrated in broken lines.

The voltage buffer VBF typically comprises an operational amplifier, which has a non-inverting input (+), an inverting input (−), and an output. The output is coupled to the inverting input via a short circuit, which constitutes a unity voltage gain feedback path. The non-inverting input of the operational amplifier constitutes an input of the voltage buffer VBF, which is coupled to the reference voltage generator VRG via the switch SW. The output of the operational amplifier constitutes an output of the voltage buffer VBF, which is coupled to the reference voltage capacitance Cr.

The reference voltage circuit RVC basically operates as follows. The reference voltage generator VRG provides an internal reference voltage VRI. The reference voltage generator VRG may derive the internal reference voltage VRI from, for example, a so-called band gap reference. The switch SW has an "on" position and an "off" position. In the on position, the switch SW applies the internal reference voltage VRI to the non-inverting input of the voltage buffer VBF. In the off position, the switch SW couples the non-inverting input of the voltage buffer VBF to signal ground.

The voltage buffer VBF is capable of charging or discharging the reference voltage capacitance Cr by means of an output current. Accordingly, the voltage buffer VBF controls a voltage that is present on the reference voltage capacitance Cr. This voltage is the reference voltage VR, which the two amplifiers AMP1, AMP2 illustrated in FIG. 1 receive. The voltage that is present on the reference voltage capacitance Cr will be referred to as applied reference voltage VRO hereinafter.

Let it be assumed that the switch SW is switched from the off position to the on position. This constitutes a power on situation for the stereo amplifier arrangement SAA illustrated in FIG. 1. The input of the voltage buffer VBF will have a voltage that rises from signal ground to the internal reference voltage VRI within a relatively short interval of time. The applied reference voltage VRO will typically be smaller than the internal reference voltage VRI when the switch SW is switched from the off position to the on position. As a result, the output current of the voltage buffer VBF will have a positive polarity, which charges the reference voltage capacitance Cr. The output current will continue to charge the reference voltage capacitance Cr until the applied reference voltage VRO is substantially equal to the internal reference voltage VRI.

Let it now be assumed that the switch SW is switched from the on position to the off position. This constitutes a power off situation for the stereo amplifier arrangement SAA illustrated in FIG. 1. The voltage at the input of the voltage buffer VBF will drop to zero in a relatively short interval of time. The applied reference voltage VRO will still be greater than zero once the voltage at the input has dropped to zero. As a result, the output current of the voltage buffer VBF will have a negative polarity, which discharges the reference voltage capacitance Cr. The output current will continue to discharge the reference voltage capacitance Cr until the applied reference voltage VRO is substantially equal to zero. The aforementioned applies unless the stereo amplifier arrangement SAA is switched on relatively shortly after having been switched off.

In either of the aforementioned situations, power on or power off, the output current of the voltage buffer VBF has a given magnitude at a given instant. The magnitude of the output current determines a rate at which the reference voltage capacitance Cr is charged or discharged, respectively. That is, the magnitude of the output current determines a rate at which the applied reference voltage VRO increases or decreases, respectively.

Figure 3:
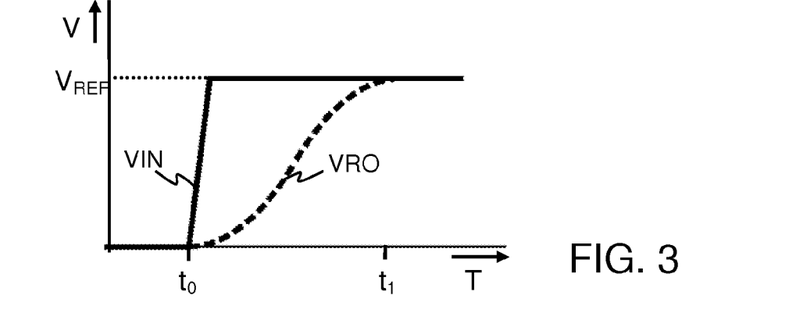
FIG. 3 is a signal diagram that illustrates a transitional behavior of the reference voltage circuit.

FIG. 3 illustrates a power on situation. FIG. 3 comprises a graph with a horizontal axis, which represents time T, and a vertical axis, which represents voltage V. A curve in the form of a relatively thick full line represents the voltage at the input of the voltage buffer VBF. This voltage, which is designated as VIN, will be referred to as input voltage VIN hereinafter. Another curve in the form of a relatively thick broken line represents the applied reference voltage VRO. The power on situation extends from instant $t_0$, when the stereo amplifier arrangement SAA is switched on, to instant $t_1$, when a steady state situation is reached. The input voltage VIN reaches a steady state value $V_{REF}$ relatively quickly, well before $t_1$. The steady state value $V_{REF}$ corresponds with the internal reference voltage VRI.

The applied reference voltage VRO gradually increases from zero to the steady state value $V_{REF}$ in accordance with an S-curve characteristic. That is, the curve that represents the applied reference voltage VRO is S-shaped. The curve has a first derivative that is substantially equal to zero at instant $t_0$ when the applied reference voltage VRO departs from zero. The first derivative is also substantially equal to zero at instant $t_1$ when the applied reference voltage VRO reaches the steady state value $V_{REF}$. Stated in popular terms, the applied reference voltage VRO exhibits a smooth takeoff and a smooth landing. The applied reference voltage VRO exhibits a similar S-shaped behavior in a power off situation. This is achieved by appropriately controlling the output current of the voltage buffer VBF as described hereinafter.

The controller CTRL illustrated in FIG. 1 preferably controls the switch SW in the following fashion. Let it be assumed that the audio system ASY is switched on. In that case, the controller CTRL puts the switch SW in the on position as soon as the internal reference voltage VRI is available. This corresponds with instant $t_0$ in FIG. 3. Let it now be assumed that the audio system ASY is switched off. In that case, the controller CTRL puts the switch in the off position while maintaining the supply voltage VCC for a relatively short interval of time. The applied reference voltage VRO smoothly drops to zero in accordance with an S-shaped curve during this time interval.

FIG. 2, which illustrates the reference voltage circuit RVC, is referred to again. The negative slope module NSM, the positive slope module PSM, and the minimum selection module MSM, constitute a current limiting arrangement that limits the output current of the voltage buffer VBF to a maximum magnitude IMX. Consequently, this current limiting arrangement imposes a limit on the rate at which the applied reference voltage VRO increases or decreases, whichever applies. The current limiting arrangement controls the maximum magnitude IMX of the output current of the voltage buffer VBF as a function of the applied reference voltage VRO.

In more detail, the negative slope module NSM provides a negative slope signal SN on the basis of the applied reference voltage VRO. The negative slope signal SN has a magnitude that decreases when the applied reference voltage VRO increases. The negative slope signal SN is preferably equal to zero when the applied reference voltage VRO is equal to the internal reference voltage VRI. FIG. 2 illustrates this by means of a broken line, via which the negative slope module NSM receives the internal reference voltage VRI.

The positive slope module PSM provides a positive slope signal SP on the basis of the applied reference voltage VRO. The positive slope signal SP has a magnitude that increases when the applied reference voltage VRO increases. In a power off situation, the positive slope signal SP is preferably equal to zero when the applied reference voltage VRO is equal to zero. In a power on situation, the positive slope signal SP is preferably equal to zero when the power on situation starts, that is, when the stereo amplifier arrangement SAA is switched on. The applied reference voltage VRO will typically be zero when the power on situation starts.

The applied reference voltage VRO may have an initial value that is substantially greater than zero if the stereo amplifier arrangement SAA is switched on relatively shortly after having been switched off. This is because the reference voltage capacitance Cr will still comprise an electrical charge in that case. The sample-and-hold circuit SHC, which is optional, may retain this initial non-zero value and apply this value to the positive slope module PSM. The positive slope module PSM may than cause the magnitude of the positive slope signal SP to vary as a function of the difference between the applied reference voltage VRO and the initial non-zero value.

The minimum selection module MSM receives the negative slope signal SN and the positive slope signal SP. The minimum selection module MSM effectively determines which of these signals has the smallest magnitude. More specifically, the minimum selection module MSM controls the maximum magnitude IMX of the output current of the voltage buffer VBF on the basis of the signal that has the smallest magnitude. Consequently, the maximum magnitude IMX of the output current varies as a function of the magnitude of the negative slope signal SN if this magnitude is smaller than that of the positive slope signal SP. Conversely, the maximum magnitude IMX of the output current varies as a function of the magnitude of the positive slope signal SP if this magnitude is smaller than that of the negative slope signal SN.

Stated otherwise, the minimum selection module MSM effectively hands control of the maximum magnitude IMX of the output current either to the negative slope signal SN or to the positive slope signal SP, depending on which of these two signals has the smallest magnitude. This allows a smooth takeoff and a smooth landing of the applied reference voltage VRO in a power on situation as well as in a power off situation.

Figure 4:
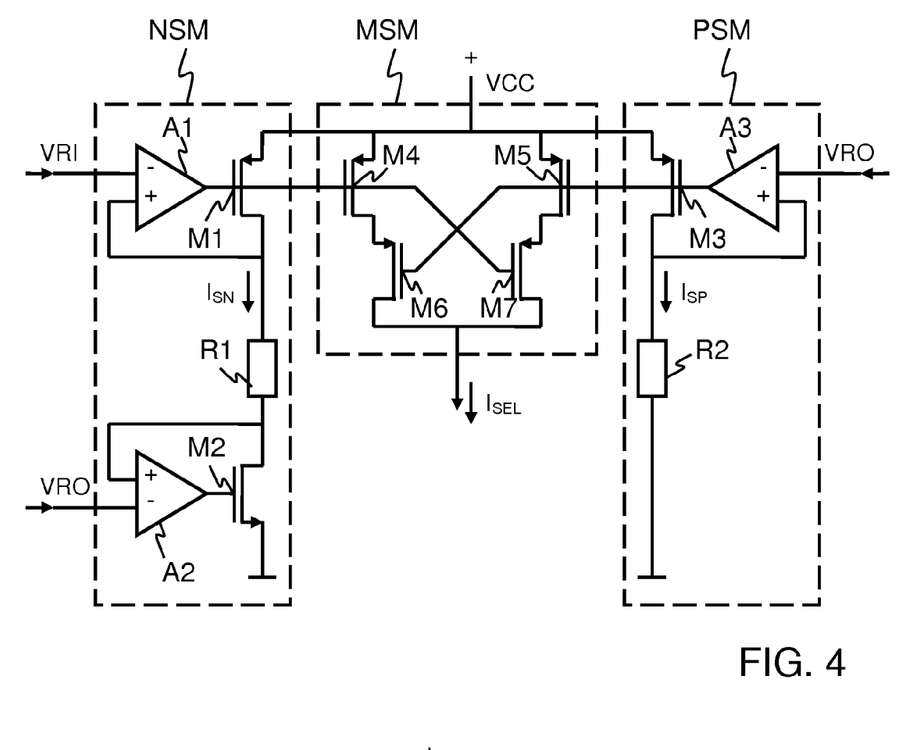
FIG. 4 is a circuit diagram that illustrates an implementation of various blocks in the reference voltage circuit.

FIG. 4 illustrates an implementation of the various modules NSM, PSM, MSM that constitute the current limiting arrangement for the voltage buffer VBF. This implementation comprises three operational amplifiers A1, A2, A3, seven transistors M1-M7, and two resistances R1, R2. Each transistor may be, for example, of the field effect type with a gate, a source, and a drain. Each operational amplifier has an inverting input (−), a non-inverting input (+), and an output.

More specifically, the negative slope module NSM comprises operational amplifiers A1, A2, transistors M1, M2, and resistor R1. Operational amplifier A1 receives the internal reference voltage VRI at its inverting input. The output of operational amplifier is coupled to the gate of transistor M1, whose drain is coupled to the inverting input of operational amplifier A1. Operational amplifier A2 receives the applied reference voltage VRO at its inverting input. Similar to operational amplifier A1, the output of operational amplifier A2 is coupled to the gate of transistor M2, whose drain is coupled to the inverting input of operational amplifier A2. Resistance R1 is coupled between respective drains of transistor M1 and transistor M2.

The positive slope module PSM comprises operational amplifier A3, transistor M3, and resistor R2. Operational amplifier A3 receives the applied reference voltage VRO at its inverting input. The output of operational amplifier A3 is coupled to the gate of transistor M3, whose drain is coupled to the inverting input of operational amplifier A3. Resistance R2 is coupled between the drain of transistor M3 and signal ground.

The minimum selection module MSM comprises transistors M4-M7. The gate and the source of transistor M4 are coupled to the gate and the source of transistor M1. Likewise, the gate and the source of transistor M5 are coupled to the gate and the source of transistor M3. In effect, transistor M4 and transistor M5 constitute respective inputs of the minimum selection module MSM, which are coupled to the negative slope module NSM and the positive slope module PSM, respectively. The source of transistor M6 is coupled to the drain of transistor M4, whereas the gate of transistor M6 is coupled to the gate of transistor M5. Similarly, the source of transistor M7 is coupled to the drain of transistor M5, whereas the gate of transistor M7 is coupled to the gate of transistor M4. Transistors M4-M7 are arranged in a so-called cross coupled cascode configuration. The respective drains of transistor M6 and transistor M7 are mutually coupled and constitute an output of the minimum selection module MSM.

The implementation illustrated in FIG. 4 operates as follows. In the negative slope module NSM, operational amplifier A1 and transistor M1 constitute a voltage follower circuit, which imposes the internal reference voltage VRI onto the drain of transistor M1. Operational amplifier A2 and transistor M2 equally constitute a voltage follower circuit, which imposes the applied reference voltage VRO onto the drain of transistor M2. Accordingly, a current will flow through resistance R1, which varies as a function of the difference between the internal reference voltage VRI and the applied reference voltage VRO. This current decreases as the applied reference voltage VRO increases. The current, which flows through resistance R1, will therefore be referred to as negative slope current $I_{SN}$ hereinafter. The negative slope current $I_{SN}$ flows through transistor M1 via the source and the drain of this transistor.

In the positive slope module PSM, operational amplifier A3 and transistor M3 constitute a voltage follower circuit, which imposes the applied reference voltage VRO onto the drain of transistor M3. Accordingly, a current will flow through resistance R2, which decreases as the applied reference voltage VRO increases. This current will therefore be referred to as positive slope current $I_{SP}$ hereinafter. The positive slope current $I_{SP}$ flows through transistor M3 via the source and the drain of this transistor.

In the minimum selection module MSM, transistor M4 seeks to duplicate the negative slope current $I_{SN}$, which flows through transistor M1. Transistor M5 seeks to duplicate the positive slope current $I_{SP}$, which flows through transistor M3. Transistor M6 and transistor M7 constitute a current selector. Let it be assumed transistor M6 receives a voltage at its gate that is substantially lower than the voltage which transistor M7 receives at its gate. In that case, transistor M6 constitutes a current follower, whereas transistor M7 effectively constitutes a current blocker. Conversely, transistor M7 will constitute a current follower, whereas transistor M6 effectively will constitute a current blocker, if transistor M7 receives a voltage at its gate that is substantially lower than the voltage which transistor M6 receives at its gate. Consequently, the minimum selection module MSM will provide a selected control current $I_{SEL}$, which is either a duplication of the negative slope current $I_{SN}$ or a duplication of the positive slope current $I_{SP}$. The aforementioned applies with the exception of a relatively narrow takeover region in which respective gate voltages are substantially equal. A smooth takeover occurs in this region.

Let it be assumed that the negative slope current $I_{SN}$ has a magnitude that is substantially greater than the magnitude of the positive slope current $I_{SP}$. In that case, there will be a voltage difference between the gate and the source of transistor M1, which is substantially greater than the voltage difference between the gate and the source of transistor M3. Consequently, transistor M7 receives a substantially lower voltage at its gate than transistor M6. Transistor M7 will be the current follower and transistor M6 will be the current blocker in that case. A duplication of the positive slope current $I_{SP}$, which transistor M5 provides, will constitute the selected control current $I_{SEL}$. The minimum selection module MSM has effectively selected the positive slope current $I_{SP}$ whose magnitude is smaller than the negative slope current $I_{SN}$. In a similar fashion, the minimum selection module MSM will select the negative slope current $I_{SN}$ if the magnitude of this current is substantially smaller than that of the positive slope current $I_{SP}$. In that case, the negative slope current $I_{SN}$ will constitute the selected control current $I_{SEL}$.

There are various manners in which the selected control current $I_{SEL}$ can set the maximum magnitude IMX of the output current of the voltage buffer VBF illustrated in FIG. 2. Each manner is associated with a particular type of implementation of the voltage buffer VBF. Various implementations are described hereinafter by way of example.

Figure 5:
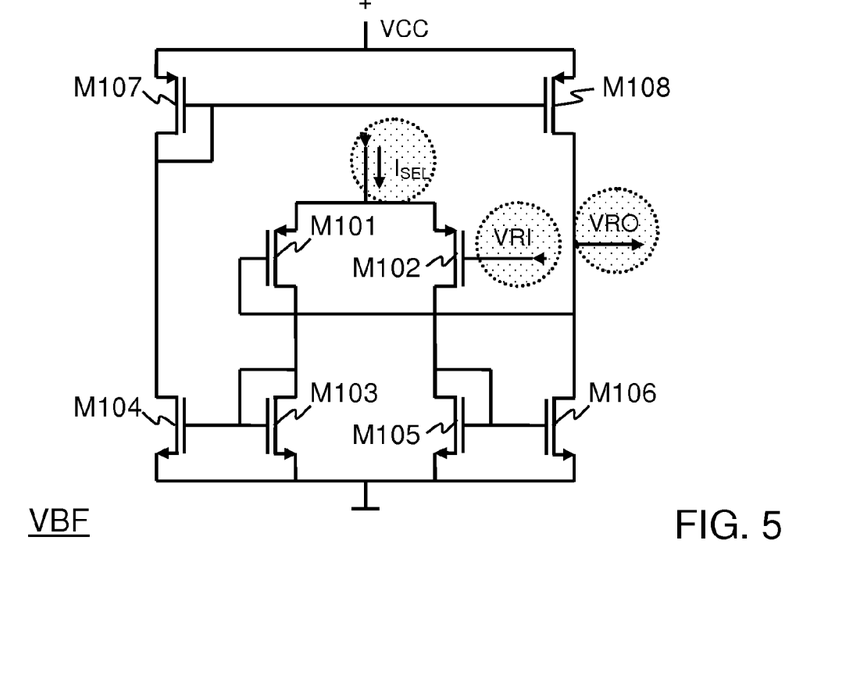
FIG. 5 is a circuit diagram that illustrates a basic implementation of a voltage buffer, which forms part of the reference voltage circuit.

FIG. 5 illustrates a basic implementation of the voltage buffer VBF, which will be referred to as basic voltage buffer hereinafter. The basic voltage buffer comprises eight transistors M101-M108, which may be, for example, of the field effect type. Transistor M101 and transistor M102 constitute a differential pair, which receives the selected control current $I_{SEL}$ as a tail current. The gate of transistor M102 receives the internal reference voltage VRI. The gate of transistor M101 is coupled to an output of the basic voltage buffer on which the applied reference voltage VRO is present. The respective drains of transistor M106 and transistor M108, which are coupled to each other, constitute this output. Transistors M101, M102 are of equal size. The same applies to transistors M103, M104, transistors M105, M106, and transistors M107, M108.

The basic voltage buffer operates as follows. The differential pair, which is formed by transistors M101, M102, provides a differential current, which has two components: a drain current of transistor M101 and a drain current of transistor M102. This differential current varies as a function of the difference between the internal reference voltage VRI and the applied reference voltage VRO, which is present at the output of the basic voltage buffer. The drain current of transistor M101 is twice mirrored by means of transistors M103, M104, M107, M108. More specifically, transistors M103, M104 constitute a first current mirror, which provides a once-mirrored version of this drain current. Transistors M107, M108 constitute a second current mirror, which provides a twice-mirrored version of the drain current of transistor M101. Transistors M105, M106 constitute a current mirror, which provides a mirrored version of the drain current of transistor M102. The output constitutes a current subtraction point at which the mirrored version of the drain current of transistor M102 is subtracted from the twice-mirrored version of the drain current of transistor M101.

The basic voltage buffer seeks to achieve a steady-state condition in which the applied reference voltage VRO is substantially equal to the internal reference voltage VRI. That is, the basic voltage buffer seeks to impose the internal reference voltage VRI on the output. Let it be assumed that the applied reference voltage VRO, which is present at the output of the voltage buffer VBF, is smaller than the internal reference voltage VRI. In that case, the drain current of transistor M101 will be larger than the drain current of transistor M102. A charge current will flow from the output of the basic voltage buffer into the reference voltage capacitance Cr illustrated in FIG. 2. Conversely, a discharge current will flow from the reference voltage capacitance Cr into the output if the applied reference voltage VRO is greater than the internal reference voltage VRI. In either case, the current has a magnitude that cannot exceed the magnitude of the selected control current $I_{SEL}$, which the minimum selection module MSM provides.

Figure 6:
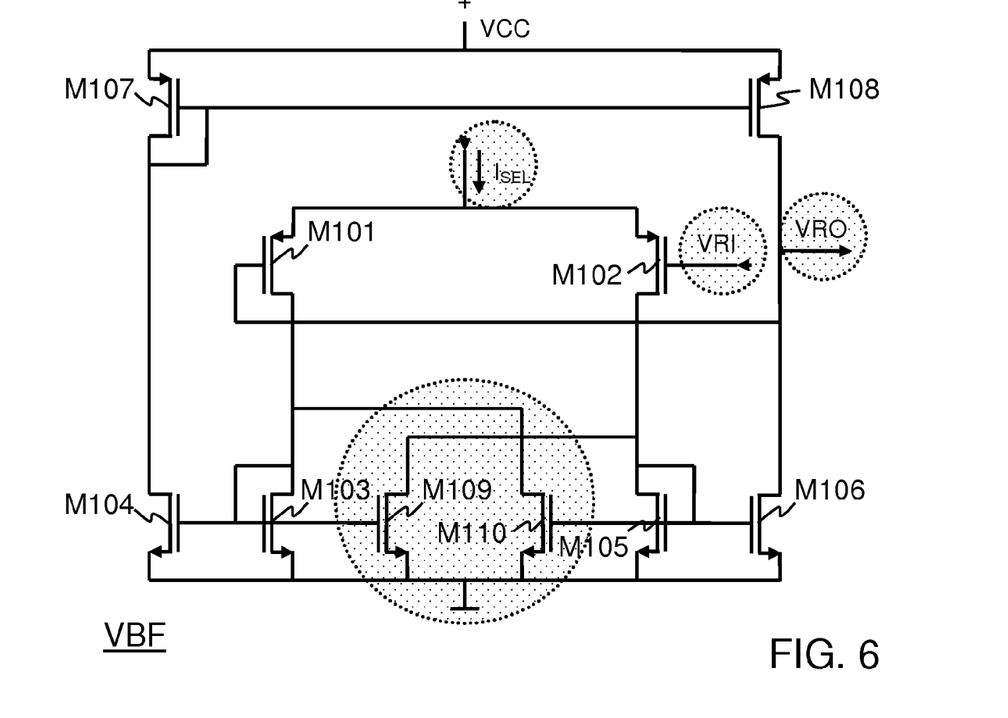
FIG. 6 is a circuit diagram that illustrates a high loop-gain implementation of the voltage buffer.

FIG. 6 illustrates a high loop-gain implementation of the voltage buffer VBF illustrated in FIG. 2. This implementation will be referred to as high loop-gain voltage buffer hereinafter. The high loop-gain voltage buffer is obtained by adding two transistors M109, M110 to the basic voltage buffer illustrated in FIG. 5. These two additional transistors M109, M110 are highlighted in FIG. 6. Each of the other transistors M101-108 of the high loop-gain voltage buffer has a corresponding transistor in the basic voltage buffer illustrated in FIG. 5. These corresponding transistors have identical reference signs.

The high loop-gain voltage buffer operates in a manner that is substantially similar to the manner in which the basic voltage buffer operates. Transistors M109, M110 effectively amplify the differential current from the differential pair, which transistors M101, M102 constitute. More precisely, transistors M103, M104, M105, M106, M109, M110 collectively constitute a differential current amplifier, which comprises two current mirrors that are cross coupled. Transistor M103 and transistor M109 form one of these two current mirrors. Transistor M105 and transistor M110 forms the other current mirror. Each current mirror provides a current gain that is somewhat less than unity. A positive feedback loop is formed by cross coupling these current mirrors. The positive feedback loop causes the differential current amplifier, which is formed by transistors M103, M104, M105, M106, M109, M110, to provide a current gain that is substantially equal to the inverse of the current gain of the aforementioned current mirrors. Accordingly, the high loop-gain voltage buffer will have a loop gain that is substantially higher than that of the basic voltage buffer. A higher loop gain allows a more accurate control of the applied reference voltage VRO.

Figure 7:
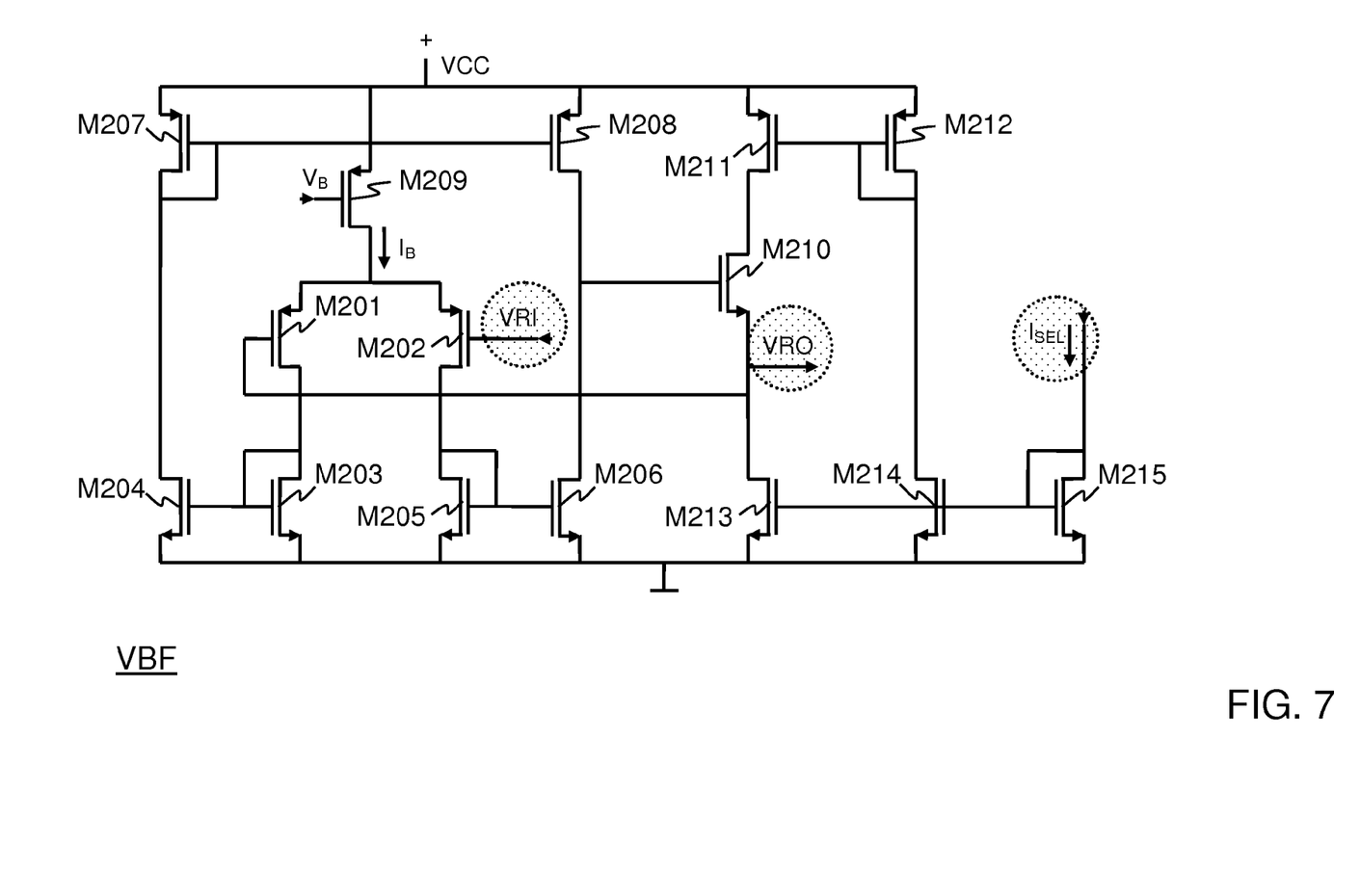
FIG. 7 is a circuit diagram that illustrates a constant loop-gain implementation of the voltage buffer.

FIG. 7 illustrates a constant loop-gain implementation of the voltage buffer VBF. This implementation will be referred to as constant loop-gain voltage buffer hereinafter. The constant loop-gain voltage buffer comprises 15 transistors M201-M215, which may be, for example, of the field effect type. Transistors M201 and M202 constitute a differential pair, which has a common source node to which transistor M209 is coupled. Transistor M209 receives a fixed bias voltage $V_B$. The gate of transistor M202 receives the internal reference voltage VRI. The gate of the other transistor M201 is coupled to an output on which the applied reference voltage VRO is present. The source of transistor M210 constitutes this output. Transistors M201, M202 are of equal size. The same applies to transistors M203, M204, transistors M205, M206, transistors M207, M208 and transistors M213, M214, M215. Transistor M211 has a so-called W/L ratio that is twice the W/L ratio of transistor M212.

The constant loop-gain voltage buffer operates as follows. Transistor M209 provides a fixed bias current $I_B$ to the differential pair, which is formed by transistors M201, M202. As a result, this differential pair has a fixed transconductance gain, contrary to the differential pair M101, M102 in FIGS. 5 and 6, which has a transconductance gain that varies as a function of the selected control current $I_{SEL}$. The differential pair M201, M202 provides a differential current which has two components: a drain current of transistor M201 and a drain current of transistor M202. This differential current varies as a function of the difference between the internal reference voltage VRI and the applied reference voltage VRO, which is present at the output of the basic voltage buffer.

Transistors M203, M204 constitute a first current mirror, which provides a once-mirrored version of the drain current of transistor M201. Transistors M207, M208 constitute a second current mirror, which provides a twice-mirrored version of the drain current of transistor M201. Transistors M205, M206 constitute a further current mirror, which provides a mirrored version of the drain current of transistor M202. The respective drains of transistors M208, M209 and the gate of transistor M210 constitute a current subtraction point at which the mirrored version of the drain current of transistor M202 is subtracted from the twice-mirrored version of the drain current of transistor M201. Transistor M210, which is arranged in a common source configuration, constitutes a voltage follower that is coupled between the aforementioned current subtraction point and the output of the constant loop-gain voltage buffer.

The constant loop-gain voltage buffer seeks to achieve a steady-state condition in which the applied reference voltage VRO is substantially equal to the internal reference voltage VRI. The constant loop-gain voltage buffer seeks to achieve this steady-state condition in a manner that is similar to the manner in which the implementations illustrated in FIGS. 5 and 6 seek to achieve the same steady-state condition. A difference is the presence of transistor M210, which allows a relatively high gain compared with the basic voltage buffer illustrated in FIG. 5.

In fact, the constant loop-gain voltage buffer is partially obtained by applying the following two modifications to the basic voltage buffer illustrated in FIG. 5, to which reference is now made. Firstly, an output transistor is added, which corresponds to transistor M210 in FIG. 7. The gate of this output transistor is coupled to the respective drains of transistors M106, M108, which are coupled to each other. The gate of transistor M101 is coupled to the source of this output transistor instead of being coupled to the respective drains of transistors M106, M108. Secondly, a supply of the selected control current $I_{SEL}$ from the minimum selection module MSM to the differential pair illustrated in FIG. 5 is replaced by a fixed tail current source, which comprises transistor M209 in FIG. 7. In the constant loop-gain voltage buffer, the selected control current $I_{SEL}$ controls the maximum magnitude of the output current in a different manner.

FIG. 7, which illustrates the constant loop-gain voltage buffer, is referred to again. Transistors M211-M215 constitute an output current limiting arrangement, which defines the maximum magnitude of the output current as a function of the selected control current $I_{SEL}$ from the minimum selection module MSM. More specifically, transistor M213 and transistor M215 constitute a current mirror, which provides a mirrored version of the selected control current $I_{SEL}$. This mirrored version of the selected control current $I_{SEL}$ constitutes a bias current for transistor M210, which is the aforementioned output transistor. The bias current that transistor M213 provides constitutes a maximum discharge current, which the constant loop-gain voltage buffer can draw from the reference voltage capacitance Cr illustrated in FIG. 2. Since the bias current is the mirrored version of the selected control current $I_{SEL}$, the selected control current $I_{SEL}$ defines this maximum discharge current.

Transistor M214 and transistor M215 equally constitute a current mirror, which provides another mirrored version of the selected control current $I_{SEL}$. This mirrored version of the selected control current $I_{SEL}$ flows through transistor M212 of which the gate and the drain are coupled to each other. That is, transistor M212 is arranged in a diode configuration and produces a voltage between its gate and its source that varies as a function of the selected control current $I_{SEL}$. This voltage is imposed between the gate and the source of transistor M211. Transistor M211, which is biased accordingly, and which has a W/L ratio that is twice of that of transistor M212, effectively prevents that the reference voltage capacitance Cr illustrated in FIG. 2, receives a charge current that exceeds the selected control current $I_{SEL}$.

Let it be assumed that the constant loop-gain voltage buffer provides a charge current, which is substantially smaller than the selected control current $I_{SEL}$. In that case, transistor M210 will have a drain current that is equal to the sum of the charge current and the bias current that transistor M213 provides, which is substantially equal to the selected control current $I_{SEL}$. The drain current will be substantially smaller than twice the selected control current $I_{SEL}$ in that case. In such a case, transistor M211 constitutes a resistance through which the drain current flows. Transistor M210 constitutes a voltage follower as described hereinbefore.

Let it now be assumed that the constant loop-gain voltage buffer provides a charge current that is equal to the selected control current $I_{SEL}$. In that case, a current will flow through transistor M210, which is equal to twice the selected control current $I_{SEL}$. In such a case, transistor M210 constitutes a resistance between its source and its drain, whereas transistor M211 constitutes a current source, which provides a fixed current that is twice the selected control current $I_{SEL}$. Transistor M213 absorbs, as it were, half of this fixed current from transistor M211. The charge current can therefore not exceed the selected control current $I_{SEL}$. This current-limiting situation ceases when the charge current becomes smaller than the selected control current $I_{SEL}$. The current-limiting situation will again apply when the charge current increases to a point where this current is equal to the selected control current $I_{SEL}$.

An advantage of the constant loop-gain voltage buffer is that the loop gain is independent of the selected control current $I_{SEL}$. This contributes to a precise and stable operation.

FIG. 4, which illustrates an implementation of the minimum selection module MSM, is referred to again. This particular implementation carries out a minimum selection in a current domain. A minimum signal selection can also be accomplished in a voltage domain. That is, the negative slope signal SN and the positive slope signal SP, which are illustrated in FIG. 2, may equally be voltages instead of currents.

Figure 8:
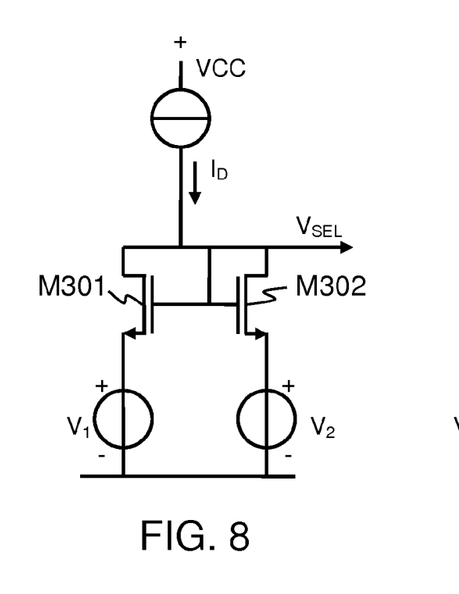
FIG. 8 is a circuit diagram that illustrates an example of a minimum voltage selector, which can be used in an implementation of the reference voltage circuit.

FIG. 8 illustrates an example of a minimum voltage selector, which may form part of a voltage-based implementation of the minimum selection module MSM. The minimum voltage selector comprises two transistors M301, M302, which may be, for example, of the field effect type. Each transistor is arranged in a diode configuration, which implies that the drain and the gate of each transistor are coupled to each other. The source of transistor receives a first signal voltage $V_1$. The source of transistor receives a second signal voltage $V_2$. The respective gate and drains of the two transistors M301, M302 are coupled to each other so as to form a common gate-drain node. A bias current $I_D$ is applied to this common gate-drain node, which flows to signal ground via the two transistors M301, M302. The common gate-drain node provides a selected voltage $V_{SEL}$ which is determined by the smaller of the two aforementioned two signal voltages $V_1$, $V_2$. That is, the minimum voltage selector effectively selects the smaller of the two aforementioned signal voltages $V_1$, $V_2$.

Figure 9:
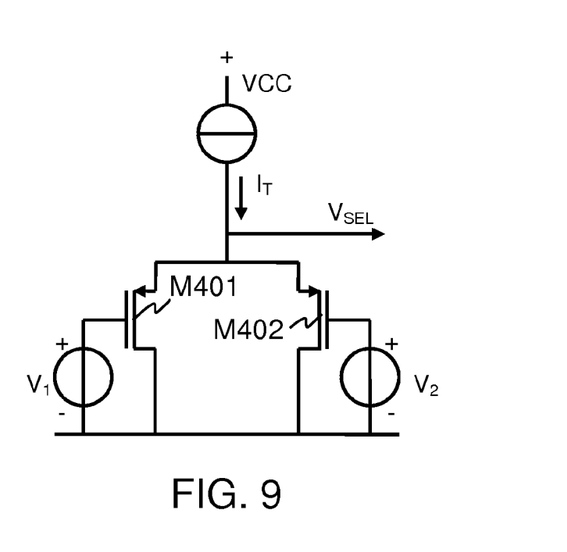
FIG. 9 is a circuit diagram that illustrates another example of a minimum voltage selector, which can be used in an implementation of the reference voltage circuit

FIG. 9 illustrates another example of a minimum voltage selector. The minimum voltage selector comprises two transistors M401, M402, which form a differential pair. Transistor M401 receives a first signal voltage $V_1$ at its gate. Transistor M402 receives a second signal voltage $V_2$ at its gate. The differential pair comprises a common source node, which receives a tail current $I_T$. The common source node provides a selected voltage $V_{SEL}$, which is determined by the smaller of the two aforementioned signal voltages $V_1$, $V_2$. The minimum voltage selector thus effectively selects the smaller of the two aforementioned signal voltages $V_1$, $V_2$.

CONCLUDING REMARKS

The detailed description hereinbefore with reference to the drawings is merely an illustration of the invention and the additional features, which are defined in the claims. The invention can be implemented in numerous different manners. In order to illustrate this, some alternatives are briefly indicated.

The invention may be applied to advantage in any type of product or method in which a reference voltage needs to be imposed on a capacitance. The audio system ASY illustrated in FIG. 1 is merely an example. The invention may equally be applied to advantage in, for example, a video system or any other type of system that processes signals. The reference voltage may have any given value between a supply voltage and signal ground. That is, the reference voltage need not necessarily be half the supply voltage.

There are numerous different manners to implement a circuit that is capable of providing an output current, which has a maximum magnitude that can be controlled. FIGS. 5, 6, and 7 provide a few implementation examples. Numerous other implementations are possible.

There are numerous different manners to implement the minimum selection module MSM. FIG. 4 illustrates an implementation example in which a minimum selection is made in the current domain. Other implementations may make a minimum selection in the voltage domain. FIGS. 8 and 9 provides examples of circuits that may be used in such implementations.

The description hereinbefore provides implementation examples that comprise transistors of the field effect type. Implementations that comprise bipolar transistors are also possible. It should also be noted that the negative slope module NSM, the positive slope module PSM, and the minimum selection module MSM, which are illustrated in FIG. 2, may be implemented by means of a suitably programmed processor and one or more analog-to-digital converters. That is, a minimum selection may be made in a digital domain by means of a computer program product, which causes a processor to carry out operations described in connection with the aforementioned modules.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A signal processor comprising a reference voltage circuit for imposing a reference voltage onto a capacitance, the reference voltage circuit comprising:
   a negative slope module for providing a negative slope signal (SN) having a magnitude that decreases when a voltage that is present on the capacitance increases;
   a positive slope module for providing a positive slope signal having a magnitude that increases when the voltage that is present on the capacitance increases;
   a minimum selection module for controlling a maximum current that the reference voltage circuit can apply to the capacitance substantially in dependence on the negative slope signal, if the magnitude of the negative slope signal is smaller than that of the positive slope signal, and for controlling the maximum current substantially in dependence on the positive slope signal, if the magnitude of the positive slope signal is smaller than that of the negative slope signal.

2. A signal processor according to claim 1, wherein the negative slope module comprises a comparator which compares the voltage that is present on the capacitance with a desired reference voltage, the maximum current having a lowest value if the voltage that is present on the capacitance is substantially equal to the desired reference voltage.

3. A signal processor according to claim 1, wherein the positive slope module comprises a comparator, which compares the voltage that is present on the capacitance with a signal ground voltage, the maximum current having a lowest value if the voltage that is present on the capacitance is substantially equal to the signal ground voltage.

4. A signal processor according to claim 1, wherein:
   the negative slope module comprises a transconductance circuit for providing the negative slope signal in the form of a current, which is referred to as negative slope current;
   the positive slope module comprises a transconductance circuit for providing the positive slope signal in the form of a current, which is referred to as positive slope current;
   the minimum selection module comprises a current switch, which provides a selected control current that is based on the negative slope current if the negative slope current is smaller than the positive slope current, and that is based on the positive slope current if the positive slope current is smaller than the negative slope current.

5. A signal processor according to claim 4, the reference voltage circuit comprising:
- a differential transistor pair for comparing the voltage that is present on the capacitance with a desired reference voltage, the differential transistor pair being coupled to receive the selected control current as a tail current; and
- a current mirror arrangement for providing an output current that is based on a differential current obtained from the differential transistor pair, the capacitance being coupled to receive this output current.

6. A signal processor according to claim 5, the current mirror arrangement comprising a pair of current mirrors, which are arranged in a cross-coupled configuration so as to amplify the differential current obtained from the differential transistor pair.

7. A signal processor according to claim 4, the reference voltage circuit comprising an output stage being coupled to provide an' output current to the capacitance, the output stage comprising a biasing circuit for limiting the output current as a function of the selected control current.

8. A signal processor according to claim 4, the minimum selection module comprising:
- a first current-copying transistor that is coupled to provide a copy of the negative slope current;
- a second current-copying transistor that is coupled to provide a copy of the positive slope current;
- a first cascode transistor that has a main terminal, which is coupled to a main terminal of the first current-copying transistor, and that has a control terminal, which is coupled to a control terminal of the second current-copying transistor; and
- a second cascode transistor that has a main terminal, which is coupled to a main terminal of the second current-copying transistor, and that has a control terminal, which is coupled to a control terminal of the first current-copying transistor.

9. A signal processor according to claim 1, the signal processor comprising an amplifier coupled to receive the voltage that is present on the capacitance as a reference voltage.

10. A method of imposing a reference voltage onto a capacitance, the method comprising:
- a negative slope signal generation step in which a negative slope signal is generated, the negative slope signal having a magnitude that decreases when a voltage that is present on the capacitance increases;
- a positive slope signal generation step in which a positive slope signal is generated, the positive slope signal having a magnitude that increases when the voltage that is present on the capacitance increases;
- a minimum selection step in which a maximum current that can be applied to the capacitance is substantially controlled in dependence on the negative slope signal, if the magnitude of the negative slope signal is smaller than that of the positive slope signal, and in which step the maximum current is substantially controlled in dependence on the positive slope signal, if the magnitude of the positive slope signal is smaller than that of the negative slope signal.

11. A computer program product for a programmable processor, the computer program product comprising a set of instructions that, when loaded into the programmable processor, causes the programmable processor to carry out the method according to claim 10.

* * * * *